United States Patent [19]
Zertani et al.

[11] Patent Number: 5,359,201
[45] Date of Patent: Oct. 25, 1994

[54] AFTERTREATMENT APPARATUS FOR IMAGEWISE EXPOSED PRINTING PLATES

[75] Inventors: Rudolf Zertani, Mainz; Helmuth Haberhauer, Taunusstein; Norbert Kraemer, Heidenrod, all of Fed. Rep. of Germany

[73] Assignee: Hoechst Aktiengesellschaft, Frankfurt am Main, Fed. Rep. of Germany

[21] Appl. No.: 98,065

[22] Filed: Jul. 28, 1993

[30] Foreign Application Priority Data

Aug. 5, 1992 [DE] Fed. Rep. of Germany ....... 4225831

[51] Int. Cl.$^5$ ............................ G03F 7/20; G03F 7/38
[52] U.S. Cl. ............................ 250/492.1; 250/455.11
[58] Field of Search ........................ 250/492.1, 455.11

[56] References Cited

U.S. PATENT DOCUMENTS

| | | | |
|---|---|---|---|
| 3,144,331 | 8/1964 | Thommes | 96/27 |
| 3,859,091 | 1/1975 | Wessells et al. | 96/36.3 |
| 4,298,803 | 11/1981 | Matsuua et al. | 250/492.2 |
| 4,300,052 | 11/1981 | Thawley et al. | 250/492.1 |
| 4,716,097 | 12/1987 | Weed | 430/327 |
| 4,899,057 | 2/1990 | Koji | 250/455.11 |
| 5,124,559 | 6/1992 | Zertani et al. | 250/492.1 |

FOREIGN PATENT DOCUMENTS

| | | |
|---|---|---|
| 0450486 | 10/1991 | European Pat. Off. . |
| 1214085 | 4/1966 | Fed. Rep. of Germany . |
| 2412571 | 11/1974 | Fed. Rep. of Germany . |

*Primary Examiner*—Jack I. Berman
*Attorney, Agent, or Firm*—Foley & Lardner

[57] ABSTRACT

An aftertreatment apparatus and method for printing plates which have been imagewise exposed having an exposure station and a heating station which are arranged one behind the other in the direction of conveyance of the printing plates along a conveyance track. The exposure station contains a linear LED arrangement which in turn has at least two rows of LED modules which are offset with respect to one another. The LED modules are made up of a plurality of light-emitting diodes. The housing of the heating station is thermally insulated on three sides and is open at the bottom in the direction of a reflector table over which the printing plates are passed.

22 Claims, 3 Drawing Sheets

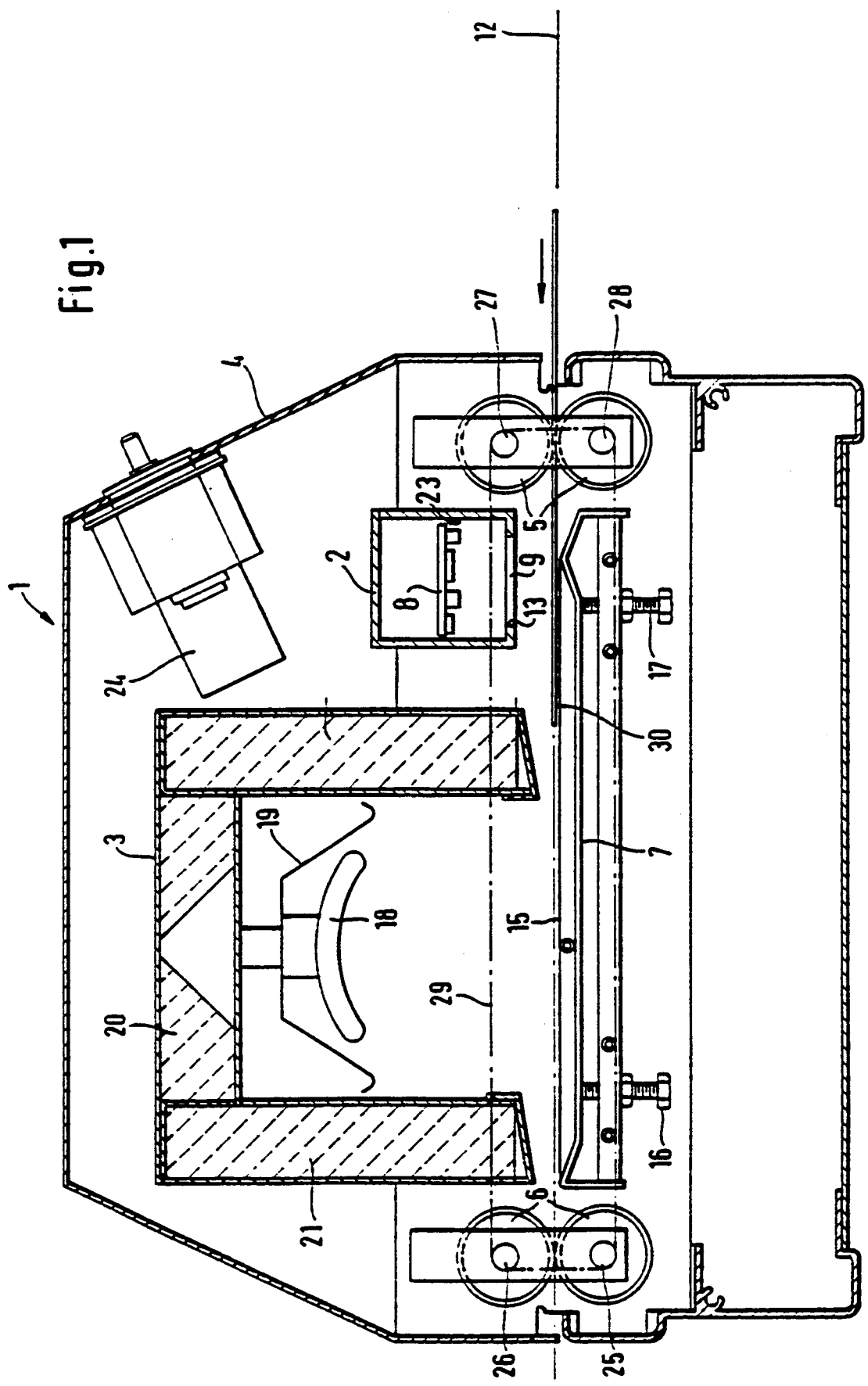

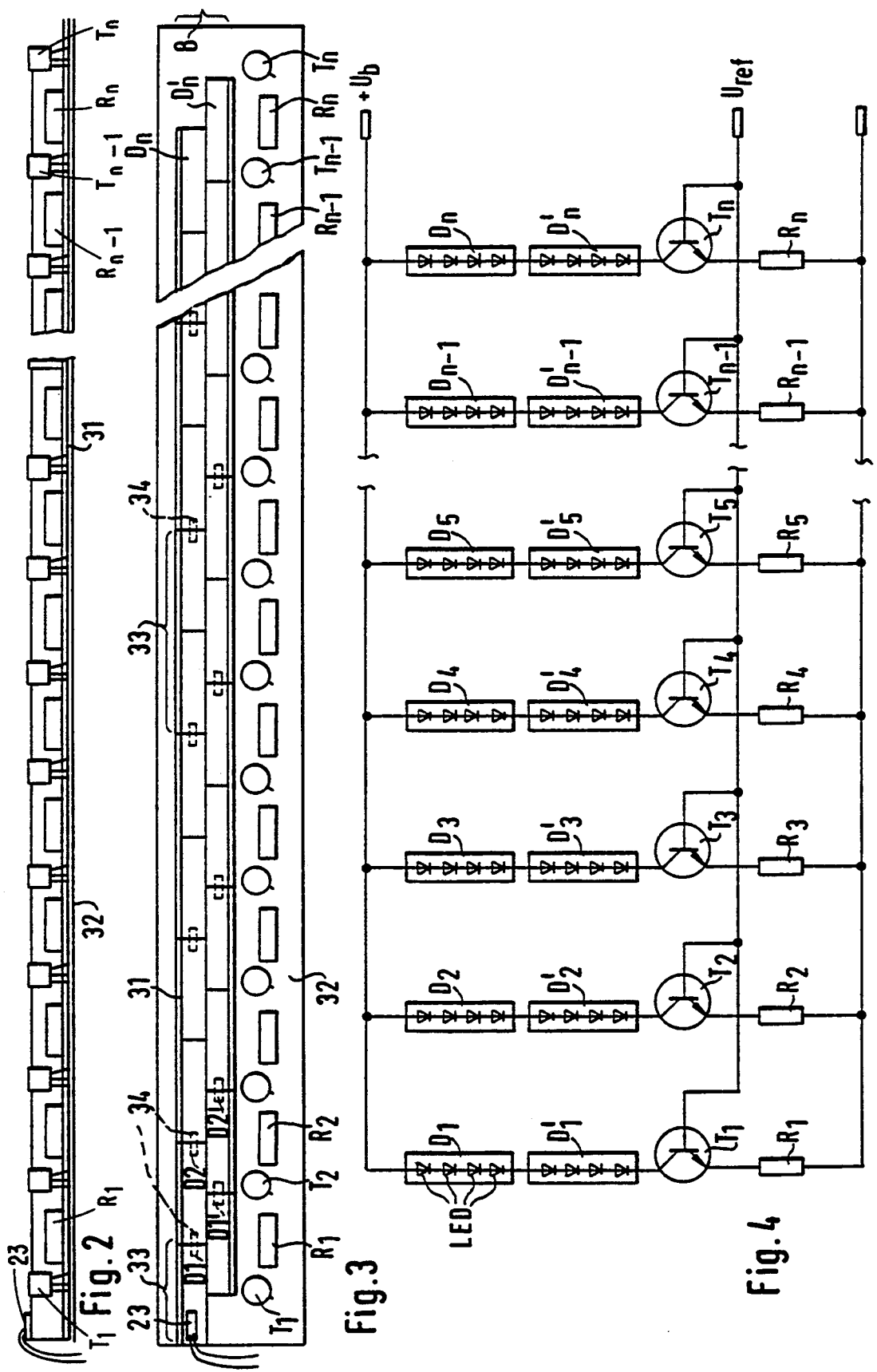

AFTERTREATMENT APPARATUS FOR IMAGEWISE EXPOSED PRINTING PLATES

BACKGROUND OF THE INVENTION

The present invention relates to an aftertreatment apparatus for imagewise exposed printing plates. More particularly, the present invention relates to an apparatus for aftertreatment of imagewise exposed printing plates comprising an exposure station which is inserted upstream of a heating station in which there is disposed in a housing lined on three sides with an insulation, an IR radiation source which radiates downwards through the housing, which is open at the bottom, and onto a reflector table over which the printing plate passes through the aftertreatment apparatus.

Such an apparatus is disclosed in EP-A-0 450 486 (DE-A 40 11 023), but makes use of a fluorescent lamp having a color filter placed in front of it in the exposure station. Upon ageing, however, a spectral alteration develops which has a disadvantageous effect on the optimum exposure of the printing plates since the latter occurs only in a narrow spectral range.

From DE-B 12 14 085 (U.S. Pat. No. 3,144,331) it is known to restore the sensitivity of photopolymerizable recording materials, which have been applied as a photosensitive layer to a printing plate support and whose sensitivity has fallen as a result of absorption of molecular oxygen, by exposure to 70 to 98% of the radiation dose of an actinic radiation which would be necessary to initiate a photopolymerization with uniform incidence. The exposure is carried out through the printing plate support, which is, for example, transparent, an actinic radiation being used which has a wavelength such that only 10 to 70% of the radiation is absorbed by the photopolymerizable layer. In this process the exposure is in principle first diffuse and then imagewise. The preexposure is carried out with lower intensity, namely with 70 to 98% of the radiation intensity which is necessary to achieve the full exposure action. This preexposure is then followed by the imagewise exposure with full radiation intensity.

U.S. Pat. No. 4,298,803 describes a process in which a photoresist layer is preexposed with an intensity which is lower than the critical exposure intensity at which the photoresist can be largely dissolved away at the exposed points. After this preexposure, the imagewise exposure of the photoresist layer takes place. The sequence of the two exposures can be interchanged. In both cases, the photosensitivity of the photoresist layer is improved, as a result of which the processing time is considerably shortened. In the apparatus used for this process, both the imagewise exposure and the preexposure or afterexposure of the photoresist can be carried out by means of an electron beam, or by a UV or X-ray source.

U.S. Pat. No. 4,716,097 likewise discloses a process in which a photopolymeric layer containing a dyestuff is first diffusely and then imagewise exposed with light having a wavelength above 400 nm and an intensity of at least 1500 lumens/m$^2$.

German Offenlegungsschrift DE-A 24 12 571 discloses a process for curing a light-curable polymer layer of a printing plate, in which exposure is first carried out diffusely for a short time and then imagewise until the polymer layer is virtually completely cured in the exposed areas. The diffuse exposure duration is not more than 90% of the time within which the complete curing of the polymer layer takes place with equal intensity of the radiation both for the preexposure and for the imagewise exposure.

SUMMARY OF THE INVENTION

Accordingly, it is an object of the present invention to provide an aftertreatment apparatus for treating imagewise exposed printing plates, in which the spectral alteration of the light source of the exposure station does not occur as a result of ageing, and a uniform, controllable luminosity is obtained over the full length of the respective exposure section of the printing plates.

In accomplishing this object, there has been provided according to one aspect of the invention an aftertreatment apparatus having an exposure station, a heating station and a reflector table. The heating station comprises an insulated housing with an open bottom in which an IR radiation source is located. The heating station is positioned so that its open bottom faces the reflector table, which in a preferred embodiment resembles a trough. An exposure station is located upstream of the heating station relative to the direction in which the printing plates are conveyed. The exposure station comprises a first housing with an opaque upper portion and a lower portion formed by a light scattering plate. A linear LED arrangement is located within the housing and means are provided for varying the luminosity of the linear LED arrangement over a luminosity range or luminous-power range of 0 to 100%. The LED arrangement is such that a full-area exposure of the printing plate can be achieved.

In one embodiment of the invention, the linear LED arrangement radiates in a wavelength range of 565±20 nm.

In further embodiments of the invention, rows of LED modules are offset from one another and means are provided for varying the luminosity of the LED modules. Still other embodiments contemplate the use of strings atop the reflector table to prevent the printing plate from jamming, the use of an infrared dark radiator as an IR source for heating the plates after exposure, and means for conveying the printing plates.

Additionally, there has been provided according to another aspect of the invention treatment of imagewise exposed printing plates in which the imagewise exposed printing plates are first transported beneath an exposure station having an opaque upper housing portion and a light scattering plate comprising the lower portion of the housing. A linear LED arrangement is disposed within the upper portion of the housing and means are provided for varying the luminosity of the LED arrangement over a luminous power range of 0 to 100%. A diffuse illumination is created across the full width of the printing plates, which are exposed as they pass. The imagewise exposed printing plates are also conveyed between a heating station and a reflector table and heated by an IR source disposed within an insulated housing which makes up the heating station.

Further objects, features and advantages of the present invention will become apparent from the detailed description of preferred embodiments which follows, when considered together with the attached figures of drawings.

BRIEF DESCRIPTION OF THE DRAWINGS

The invention is explained in greater detail below by reference to the drawings, in which:

FIG. 1 shows a diagrammatic sectional view of the aftertreatment apparatus according to the invention;

FIGS. 2–4 show a side view, a plan view, and also the circuit of a linear LED arrangement of an exposure station of the aftertreatment apparatus;

DETAILED DESCRIPTION OF THE PREFERRED EMBODIMENTS

Figure 5:
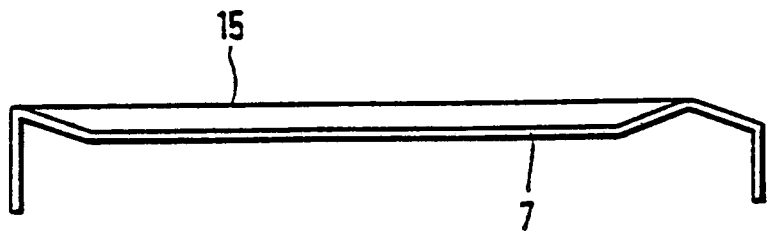
FIG. 5 shows, in section, a partial view of the reflector table of the aftertreatment apparatus.

An aftertreatment apparatus 1 contains an exposure station 2, a heating station 3, a reflector table 7 and conveyance roller pairs 5 and 6, these units preferably being enclosed by a housing 4 of the aftertreatment apparatus. Printing plates 30, one of which is shown diagrammatically in FIG. 1, pass along a conveyance track 12 of the aftertreatment apparatus 1. The inlet conveyance roller pair 5 at the beginning of the conveyance track 12 inside the apparatus, and the outlet conveyance roller pair 6 at the end of the conveyance track inside the apparatus, are present to convey the printing plate 30 through the aftertreatment apparatus. Mounted on the shafts of the conveyance rollers of these two conveyance roller pairs are end-face sprocket wheels 25, 26, 27 and 28 over which an endlessly circulating sprocket-wheel chain 29 is passed. One of the conveyance rollers of the inlet roller pair 5 is driven by an electrical motor, which is not shown. The end-face sprocket wheel of the driven conveyance roller causes the sprocket-wheel chain 29 to circulate, thereby ensuring synchronous running between the inlet roller pair and the outlet roller pair.

The exposure station 2 is inserted upstream of the heating station 3, when observed in the direction of conveyance of the printing plates 30. Situated in the exposure station 2 as a radiation source is a linear LED arrangement 8 for diffusely exposing the full area of the printing plate 30. This linear LED arrangement 8 comprises at least two rows, offset with respect to one another, of LED modules $D_1, D_2, \ldots D_n$ and $D_2 \ldots D_n$, as shown in FIGS. 2 and 3, and is situated in a closed housing of the exposure station 2. At the bottom, in the direction of the conveyance track 12 for the printing plates, the housing of the exposure station 2 has an exposure opening 13 which is covered by a light scattering plate 9.

The individual module $D_1, \ldots D_n, D_1 \ldots D_n$ generally comprises four light-emitting diodes (LEDs) which, as shown in FIG. 4, are connected in series. Two modules $D_1, D_1; D_2, D_2 \ldots D_n, D_n$ are in each case connected in series and are fed by a current source, which is not shown, having a reference voltage $U_{ref}$. Two modules connected in series are in each case controlled by an electrical circuit comprising transistor $T_i$ and current-limiting resistor $R_i$, where $i = 1, 2, \ldots n$. The resistor $R_i$ may be a fixed resistor or a variable resistor in the form of a potentiometer. The current source applies the reference voltage $U_{ref}$ to the bases of all the transistors $T_i$, which are connected in parallel. The resistors which are likewise connected in parallel, limit the emitter currents of the transistors $T_i$. The reference voltage $R_{ref}$ is a direct voltage in the range from about 0 to 3 V, in which case a base-emitter current $I_{BE}$ of about 0 to 30 mA flows, or a square-wave voltage in the range from about 0 to 6 V, with a base-emitter current $I_{BE}$ of about 0 to 60 mA and a duty cycle of about 1:2.

The current source of the reference voltage $U_{ref}$ supplies a current in the order of magnitude of about 100 mA and may, for example, be a D/A converter having a buffer stage, or a separate control circuit.

The effective luminosity of the linear LED arrangement 8 is measured by the sensor 23. In order that a uniform illumination is obtained over the entire width of the linear LED arrangement 8, LED modules from the same manufacture are used. If differences in brightness nevertheless occur between the individual modules, they are equalized by altering the associated resistor $R_i$.

The LED modules $D_1, D_1, \ldots D_n, D_n$ are disposed on segments 33 which have the same or different lengths and, as can be seen from FIG. 3, are plugged together by means of plug contacts 34 to form a printed circuit board 31. A single module or two to four modules may be mounted on the single segment 33. The plug contacts are indicated by dotted lines in FIG. 3. One segment 33 with one and with two modules of the upper row of the linear LED arrangement 8 is in each case marked by a curved bracket. The plugged-together printed circuit board 31 is mounted on a base printed circuit board 32 on which the transistors $T_i$ and resistors $R_i$ are also disposed. Since the individual segments 33 may have different lengths, the row length can be matched to the width of the printing plate to be exposed. In the event that one or more LED modules fails, the segmented structure of the linear LED arrangement 8 makes a fast replacement possible since the functioning components do not have to be demounted. No spectral alteration, i.e. no displacement of the wavelength range emitted, occurs as the LED ages. As a result of the current control of the LED modules, a uniform luminous power can be set over the entire length of the linear LED arrangement 8, which is operated by low voltage.

To precisely dose the amount of light applied to the printing plate 30, the illuminance of the linear LED arrangement 8 of the exposure station 2 can be infinitely varied electronically between 0% and 100% of the maximum illuminance. The illuminance of said linear LED arrangement 8 is indicated digitally, a sensor being mounted in the interior of the housing of the exposure station 2 to measure the illuminance. The closed nature of the housing prevents the occurrence of external unwanted radiation which could adversely affect the measurement of the illuminance by means of the sensor 23 in an undesirable way.

The illuminance of the linear LED arrangement 8 is set by means of an electronic control 24, which is diagrammatically shown above the exposure station 2.

The spectral distribution of the linear LED arrangement 8 is in the wavelength region of $565 \pm 20$ nm.

The sensor 23 for measuring the illuminance is normally a photodiode, which is situated in the housing of the exposure station 2 and is consequently shielded from any unwanted radiation such as, for example, daylight entering the aftertreatment apparatus 1. The photodiode is expediently mounted above the printed circuit board 31 (cf. FIG. 2).

The heating station 3 is equipped with an IR radiation source 18, which is accommodated in a housing which is thermally insulated on three sides with an insulation 20, 21, 22. At the bottom, the housing is open in the direction of the reflector table 7, over which the printing plate 30 is passed through the aftertreatment apparatus 1. The radiation source 18 of the heating station 3 is, for example, an infrared dark radiator which is made of ceramic and which emits radiation in a wavelength region which is far away both from the visible wavelength region and from the radiation-sensitivity region of the printing plates. Mounted above the IR radiation source 18 is a reflector 19. The radiation emitted by the IR radiation source 18 is in a wavelength range from about 1000 nm up to over 10000 nm. As a result of this spectral region of the heat radiation, the electromagnetic radiations which act on the printing plates 30, namely, on the one hand, the above-mentioned infrared radiation for generating heat and, on the other hand, the diffuse exposure to visible light for the purpose of the so-called "afterexposure" of the printing plate which has already been imagewise exposed, can be dosed completely independently of one another.

The IR radiation 18 can be varied in its radiation power so that the printing plate can be heated to a temperature of about 80° to 120° C.

Figure 6:
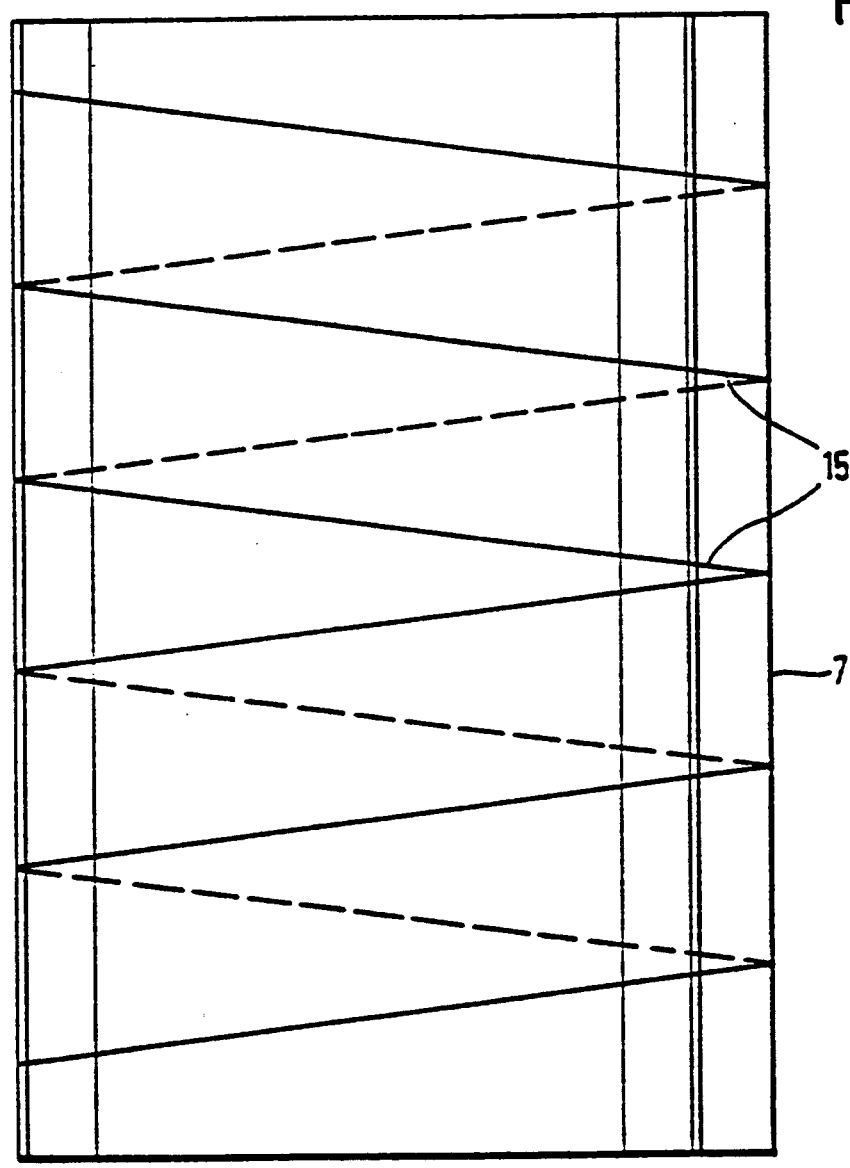
FIG. 6 shows a plan view of the reflector table shown in FIG. 5.

The reflector table 7 is formed as a trough-like hollow body which has strings 15 at the level of the conveyance track 12 of the printing plates 30, as can be seen from FIGS. 5 and 6. The strings 15 comprise either a thin metal wire or a thin plastic thread and are strung in V-shaped fashion on the upper side of the reflector table (cf. FIG. 6) so that the front corners of the printing plate cannot get underneath the strings while being conveyed through the aftertreatment apparatus 1, which would result in a printing plate blockage.

The very low heat capacity of the strings 15 compared with the printing plate 30 ensures that a heat dissipation which could result in a nonuniform heating of the printing plate cannot arise at any point on the printing plate during the heating in the area underneath the heating station 3. The inside of the reflector table 7 is lined with a heat-reflecting metal sheet. Situated on the underside of the reflector table are adjustment devices 16, 17, usually adjustment screws, which make it possible to raise and lower the base area of the trough-like reflector table 7 within a small range in order to be able to adjust, in this way, the spacing of the underside of the printing plate from the base area of the reflector table to a certain extent.

A heat dissipation from the printing plate, for example through contact between the printing plate and the metal sheet of the reflector table, could result in a partial lowering of the temperature in the region of the contact area and, consequently, in a nonuniform heating and, therefore, also in nonuniform after-curing of the photopolymer layer of the printing plate.

The aftertreatment apparatus achieves the advantages that the linear LED arrangement 8 of the exposure station 2 generates a very uniform exposure intensity over the working width of the printing plate 30 and the exposure intensity of the LED modules or of the linear LED arrangement 8 can be infinitely varied. The results of the exposure for various exposure intensities are always reproducible. An ageing of the LED modules does not cause a spectral displacement, with the result that the wavelength emitted remains largely constant. Further advantages of the aftertreatment apparatus are that no unwanted radiation can occur in the region of the exposure station and of the heating station, that the linear LED arrangement 8 can be configured as desired in its length and can be utilized for exposure over its full length and that it can be operated with low voltage and can be adjusted in the range from 0 to 100% of its luminous power.

The aftertreatment apparatus according to the invention can be used to process photopolymer printing plates, in particular projection plates and highly photosensitive laser plates, in which apparatus, as a result of the aftertreatment with light of very low and very uniform intensity and the afterheating, the service lives and the print-run length of the printing plates treated in this way can be increased considerably. For this purpose, the imagewise exposed printing plates, which have been exposed, for example, in a laser exposure apparatus to a wavelength of 488 nm or have been exposed in a projection apparatus by means of a mercury or xenon radiator, flashlight, carbon lamp or the like, are exposed a second time, i.e. afterexposed, in the aftertreatment apparatus to light of a wavelength of $\lambda = 565 \pm 20$ nm having very low intensity and then afterheated in the same apparatus to a temperature of 80° to 120° C. An advantage of this aftertreatment apparatus is that the luminosity of the exposure station can be adjusted in very wide limits.

What is claimed is:

1. An aftertreatment apparatus for treating imagewise exposed printing plates as they are conveyed, said apparatus comprising means for conveying said printing plates in a direction of conveyance; an exposure station comprising a first housing having upper and lower portions, a linear LED arrangement disposed within said upper portion of said first housing, a light scattering plate comprising said lower portion of said first housing, and means for varying the luminosity of said linear LED arrangement over a luminous power range of 0 to 100%, wherein said linear LED arrangement is of sufficient extent to expose the full width of said printing plates as they are conveyed; and a heating station located immediately downstream of said exposure station in the direction of conveyance, said heating station comprising an insulated housing with an open bottom and an IR radiation source disposed within said insulated housing; wherein said printing plates are conveyed beneath said exposure station and between said heating station and a reflector table.

2. An aftertreatment apparatus as recited in claim 1, wherein said linear LED arrangement radiates in a wavelength range of $565 \pm 20$ nm.

3. An aftertreatment apparatus as recited in claim 1, wherein said linear LED arrangement comprises at least two rows of LED modules, said rows being offset with respect to one another, and said modules each comprising a plurality of light-emitting diodes.

4. An aftertreatment apparatus as recited in claim 3, wherein each individual module contains four light-emitting diodes (LEDs), which are connected in series.

5. An aftertreatment apparatus as recited in claim 3, wherein pairs of modules are in each case connected in series and means are provided for controlling the luminosity of said pairs, said controlling means comprising in each case a transistor, a resistor, and a common current source for all the modules which supplies a reference voltage $U_{ref}$ to the bases of said transistors.

6. An aftertreatment apparatus as recited in claim 5, wherein said resistor is a variable resistor.

7. An aftertreatment apparatus as recited in claim 5, wherein the bases of said transistors are connected in parallel and said resistors are connected in parallel between the emitters of said transistors and a ground conductor.

8. An aftertreatment apparatus as recited in claim 5, wherein the reference voltage $U_{ref}$ is a direct current or a square-wave voltage having a duty cycle of 1:2.

9. An aftertreatment apparatus as recited in claim 1, further comprising means for measuring the luminosity of said linear LED arrangement disposed within said exposure station.

10. An aftertreatment apparatus as recited in claim 9, wherein said measuring means comprises a photodiode disposed within said upper portion of said first housing.

11. An aftertreatment apparatus as claimed in claim 3, wherein said linear LED arrangement comprises individual segments which are plugged together by means of plug contacts to form a printed circuit board.

12. An aftertreatment apparatus as claimed in claim 11, wherein said segments are of equal lengths.

13. An aftertreatment apparatus as recited in claim 11, wherein said segments exhibit one of at least two different lengths.

14. An aftertreatment apparatus as recited in claim 10, further comprising means for measuring the luminosity of said linear LED arrangement, said measuring means comprising a photodiode disposed on said printed circuit board, wherein said photodiode and said printed circuit board are both disposed within said first housing.

15. An aftertreatment apparatus as recited in claim 1, wherein said IR radiation source comprises an infrared dark radiator which is made of ceramic and which emits radiation in a wavelength region which is outside both the visible spectrum and the radiation-sensitivity region of said printing plates.

16. An aftertreatment apparatus as recited in claim 15, wherein said IR radiation source emits radiation in a wavelength range from 1000 to 10000 nm.

17. An aftertreatment apparatus as recited in claim 16, wherein said radiation source includes means for varying its radiation power so that said printing plates can be heated to a temperature of between 80° C. and 120° C.

18. An aftertreatment apparatus as recited in claim 1, wherein said reflector table comprises a trough-like member and strings, said strings being attached to said trough-like member at the level of conveyance of said printing plates.

19. An aftertreatment apparatus as recited in claim 18, wherein said strings comprise a thin metal wire, said wire being strung in V-shaped fashion on the upper side of said trough-like member.

20. An aftertreatment apparatus as recited in claim 18, wherein said strings comprise a thin plastic thread, said thread being strung in V-shaped fashion on the upper side of said trough-like member.

21. An aftertreatment apparatus as recited in claim 17, wherein the inside of said trough-like member is lined with a heat-reflecting metal sheet.

22. An aftertreatment apparatus for treating imagewise exposed printing plates as they are conveyed, said apparatus comprising means for conveying said printing plates in a direction of conveyance; an exposure station comprising a first housing having upper and lower portions, a linear LED arrangement disposed within said upper portion of said first housing, a light scattering plate comprising said lower portion of said first housing, and means for varying the luminosity of said linear LED arrangement over a luminous power range of 0 to 100%, wherein said linear LED arrangement is of sufficient extent to expose the full width of said printing plates as they are conveyed; and a heating station located immediately downstream of said exposure station in the direction of conveyance, said heating station comprising an insulated housing with an open bottom and an IR radiation source disposed within said insulated housing; wherein said printing plates are conveyed beneath said exposure station and between said heating station and a reflector table; said aftertreatment apparatus further comprising an inlet conveyance roller pair and an outlet conveyance roller pair which are situated upstream of said exposure station and downstream of said heating station respectively, said roller pairs each having two rolling members and two end-face sprocket wheels connected to said rolling members, said end-face sprocket wheels being driven synchronously by an endlessly circulating sprocket wheel chain, and one of said conveyance rollers being motor-driven.

* * * * *